(12) United States Patent
Won

(10) Patent No.: US 7,796,452 B2
(45) Date of Patent: Sep. 14, 2010

(54) SEMICONDUCTOR MEMORY DEVICE MAINTAINING WORD LINE DRIVING VOLTAGE

(75) Inventor: Hyung Sik Won, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 237 days.

(21) Appl. No.: 12/137,663

(22) Filed: Jun. 12, 2008

(65) Prior Publication Data

US 2009/0161461 A1    Jun. 25, 2009

(30) Foreign Application Priority Data

Dec. 20, 2007    (KR) .................... 10-2007-0134652

(51) Int. Cl.
*G11C 7/00* (2006.01)
(52) U.S. Cl. ..................... 365/203; 365/210.1
(58) Field of Classification Search ................. 365/203, 365/207, 210.1
See application file for complete search history.

(56) References Cited

U.S. PATENT DOCUMENTS

| 5,499,211 | A | * | 3/1996 | Kirihata et al. | ............. 365/203 |
| 5,701,269 | A | | 12/1997 | Fujii | |
| 5,828,594 | A | | 10/1998 | Fujii | |
| 6,473,350 | B2 | * | 10/2002 | Lee | ............................. 365/207 |
| 7,239,565 | B2 | * | 7/2007 | Liu | ............................. 365/203 |
| 7,590,017 | B2 | * | 9/2009 | Romanovskyy et al. | ...... 365/203 |

FOREIGN PATENT DOCUMENTS

| KR | 1019990030520 A | 5/1999 |
| KR | 1020000042829 A | 7/2000 |

* cited by examiner

*Primary Examiner*—Anh Phung
(74) *Attorney, Agent, or Firm*—Ladas & Parry LLP

(57) ABSTRACT

A semiconductor memory for maintaining a word line driving voltage includes a cell array and a sense amplifier adjacent to the cell array. A dummy cell is formed at a peripheral portion of the cell array in such a manner that a dummy bit line and a word line intersect. A control circuit switches the connection state between a first section of the dummy bit line passing through the cell array and a second section of the dummy bit line passing through the sense amplifier. The connection state switches according to the operation mode of the cell array. The dummy bit line is floated when the operation mode is an active mode and a precharge voltage is provided to the dummy bit line when the operation mode is a precharge mode.

10 Claims, 5 Drawing Sheets

SEMICONDUCTOR MEMORY DEVICE MAINTAINING WORD LINE DRIVING VOLTAGE

CROSS-REFERENCE TO RELATED APPLICATIONS

The present application claims priority to Korean patent application number 10-2007-0134652 filed on Dec. 20, 2007, which is incorporated herein by reference in its entirety.

BACKGROUND OF THE INVENTION

The present invention relates to a semiconductor memory device, and more particularly to a semiconductor memory device for selectively floating a dummy bit line based on the operation mode of the cell array.

As shown in FIG. 1, a typical DRAM semiconductor memory device includes bit lines BL and word lines WL. The bit lines and the word lines WL intersect to form the pattern shown in FIG. 1. In a DRAM semiconductor memory device cell arrays include a plurality of unit cells. Each unit cell consists of a transistor and a capacitor. A bit line sense amplifier SA senses and amplifies respective signals of a bit line pair BL and /BL.

The following describes the operation of the semiconductor memory device when in active mode: the word line WL becomes a high driving voltage VPP level; the bit line pair BL and /BL gradually varies from a precharge voltage VLBP level to power voltage and ground voltage levels respectively to increase the potential difference therebetween; and a dummy bit line DBL connected to a dummy cell at a peripheral region of the cell array maintains the precharge voltage VLBP level even when in the active mode.

When in active mode, a short bridge caused by process defects can be formed by self aligned contact (SAC) between the word line WL and the dummy bit line DBL in the dummy cell. When this occurs, the high driving voltage VPP level of the word line WL is lowered by the precharge voltage VBLP level of the dummy bit line DBL.

Referring to the timing diagram of FIG. 2, the VPP level voltage of the word line WL is abnormally swung between the VPP and VBLP voltage levels when in active mode since the word line WL forms a short with the bit line BL due to the SAC failure.

As such, when the voltage of the word line WL is dropped to less than the VPP level voltage, data transmission to the cell array is weakened during read and write operations.

Therefore, the conventional semiconductor memory device has a problem in that the DRAM operation properties are lowered by the above described defect.

SUMMARY OF THE INVENTION

Accordingly, the present invention provides a semiconductor memory device which ensures stable operation by maintaining a stable driving voltage of a word line according to an operation mode.

One aspect of a semiconductor memory device according to the present invention includes: a dummy cell formed in such a manner that a dummy bit line and a word line intersect each other at a peripheral portion of a cell array; and a control circuit switching a connection state between a first section of the dummy bit line passing through the cell array and a second section of the dummy bit line passing through a sense amplifier adjacent to the cell array, wherein the connection state switches based on the operation mode of the cell array, such that the dummy bit line is floated in an active mode and a precharge voltage is provided to the dummy bit line in a precharge mode.

The control circuit includes a first control part and a second control part connected to upper and lower parts of the dummy cell respectively to simultaneously float the dummy bit line in the active mode.

The first control part receives an inverted selecting signal for enabling the sense amplifying part connected to the upper part of the cell array, and the selecting signal is enabled in the active mode.

The second control part is applied with an inverted selecting signal for enabling the sense amplifying part connected to the lower part of the cell array, the selecting signal is enabled in the active mode.

Alternatively, the first and second control parts are applied with an inverted bit line equalization command signal in the active mode.

According to a second aspect of the present invention, there is provided a semiconductor memory device comprising: cell arrays including normal cells and dummy cells disposed at the peripheral portion of the cell arrays, wherein word lines and bit lines intersect each other correspondingly to the normal cells and the dummy cells; and a switching circuit switching based on the operation of the cell arrays, and floating the bit lines corresponding to the dummy cells in the active mode of the cell arrays and providing a precharge voltage to the bit lines corresponding to the dummy cell in a precharge mode.

The control circuit includes a first control part and a second control part which are respectively connected to upper and lower parts of the dummy cell and which simultaneously float the bit line corresponding to the dummy cell.

The first control part receives an inverted selecting signal for enabling the sense amplifying part connected to the upper part of the cell array, and the selecting signal is enabled in the active mode.

The second control part receives an inverted selecting signal for enabling the sense amplifying part connected to the lower part of the cell array, and the selecting signal is enabled in the active mode.

Alternatively, the first and second control parts receive an inverted bit line equalization command signal in the active mode.

The semiconductor memory device according to the present invention can maintain a stable driving voltage in the word line by selectively floating the dummy bit line according to the operation mode.

DESCRIPTION OF SPECIFIC EMBODIMENTS

Hereinafter, preferred embodiments of the semiconductor memory device according to the present invention will be described in detail with reference to the accompanying drawings.

Figure 1:
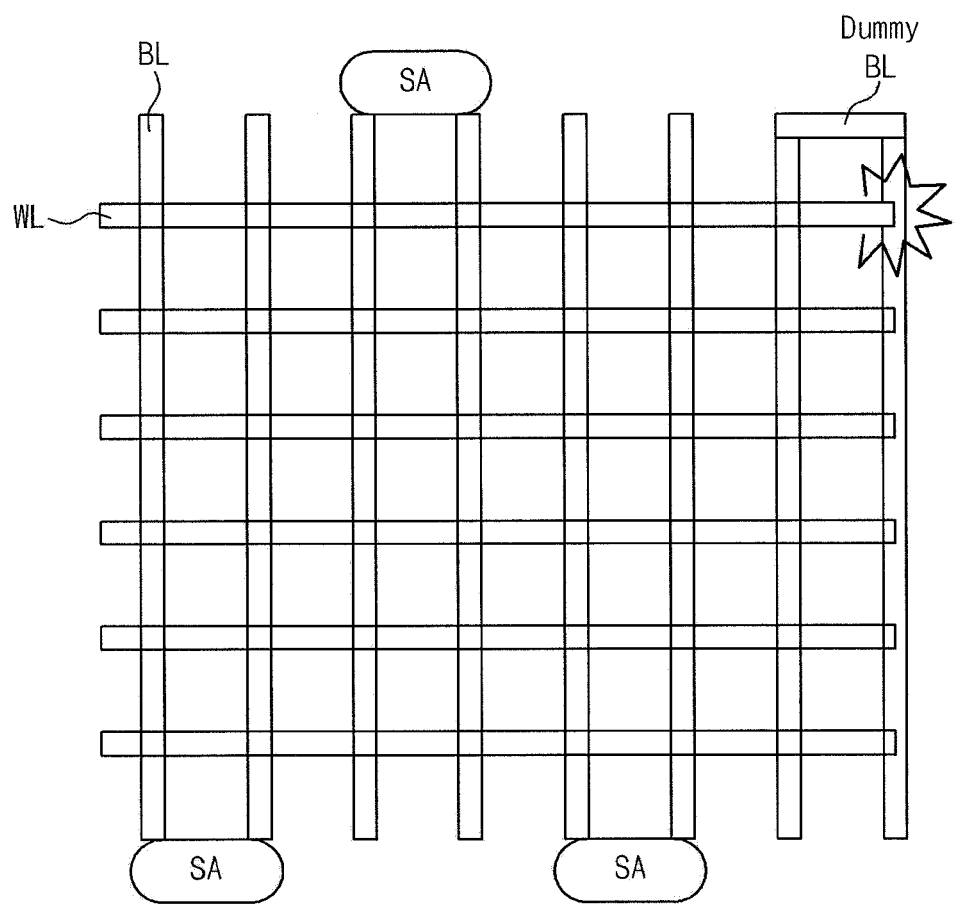
FIG. 1 is a plan view illustrating a conventional semiconductor memory device.
Figure 2:
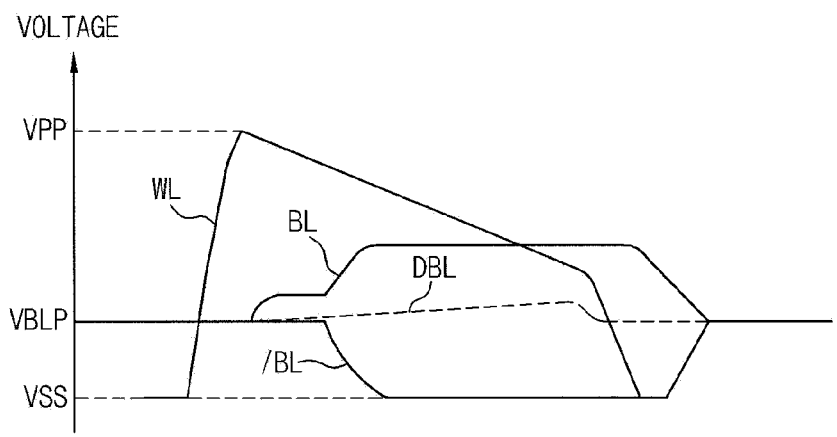
FIG. 2 is a timing diagram of the conventional semiconductor memory device.
Figure 3:
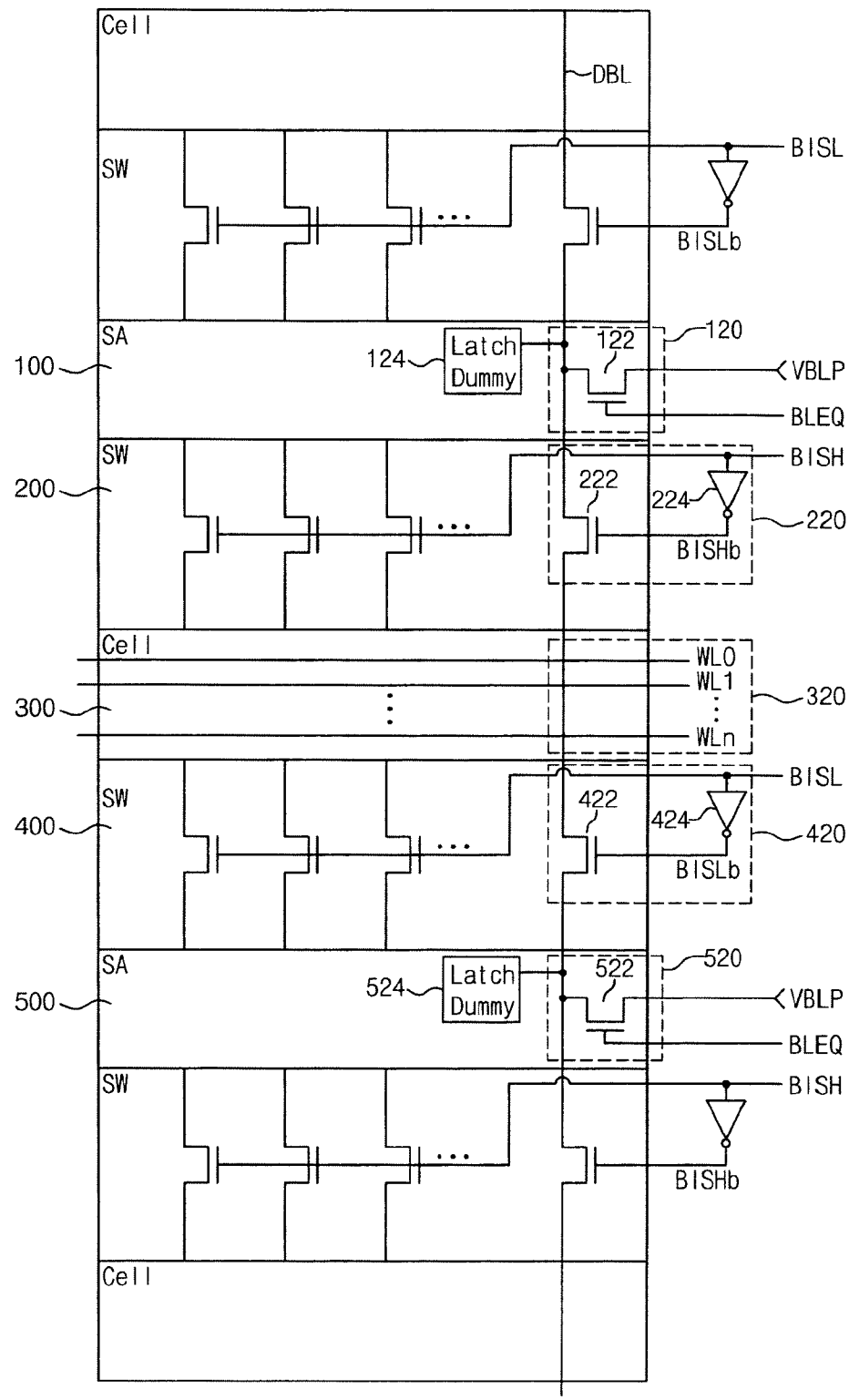
FIG. 3 is a circuit view showing a semiconductor memory device according to an embodiment of the present invention.

The present invention discloses a semiconductor memory device which maintains the driving voltage of a word line intersecting a dummy bit line wired in a dummy cell by selectively floating the dummy bit line according to the operation mode. Referring to FIG. 3, the semiconductor memory device according to the present invention includes a cell array 300 in which a plurality of unit cells are arrayed between sense amplifying parts 100 and 500 and switching parts 200 and 400. The switching parts 200 and 400 connect the cell array 300 and the upper and lower sense amplifying parts 100 and 500.

A cell at the peripheral portion of the cell array 300, in which word lines WL0~WLn and a dummy bit line DBL intersect, is referred to as a dummy cell 320. Portions at the periphery of the switching parts 200 and 400, which are connected to the dummy cell 320, are referred to as a first switching part 220 and a second switching part 420. Also, the portions of the upper and lower sense amplifying parts 120 and 520 connected to the dummy cell 320 include precharge parts 122 and 522 and dummy latch parts 124 and 524.

The first switching part 220, the second switching part 420, and the dummy bit line sense amplifying parts 120 and 520, which are connected to the dummy bit line DBL, and the dummy cell 320 are formed with the same devices and wirings as the general part of the semiconductor memory device, and thereby both the uniformity of patterns and the prevention of process defects is ensured.

As described above, the upper sense amplifying part 100 and the lower sense amplifying part 500 are disposed at an upper part and a lower part of the cell array 300. The upper and lower sense amplifying parts 100 and 500 sense and amplify the data transferred from the cell array 300 when in active mode, and they equalize the bit line to a predetermined precharge voltage VBLP level when in precharge mode.

Herein, the part of the upper sense amplifying part 120 and the lower sense amplifying part 520 that correspond to and are connected to the dummy cell 320 include precharge parts 122 and 522. The precharge parts 122 and 522 apply the precharge voltage VBLP level to the dummy bit line DBL. The dummy latch parts 124 and 524 of the upper and lower sense amplifying parts 120 and 520 are for identically realizing the disposition of devices for generally sensing and amplifying the cell data.

The dummy cell 320 is at the peripheral portion of the cell array 300, in which the word lines WL0~WLn are arranged in the vertical direction and the dummy bit line DBL is arranged perpendicular to the word lines. In active mode, the word lines WL0~WLn become a high driving voltage VPP level, and the dummy bit line DBL maintains the precharge voltage VBLP level. In precharge mode, the word lines WL0~WLn become a ground voltage VSS level, and the dummy bit line DBL maintains the precharge voltage VBLP level.

The first switching part 220 and the second switching part 420 control the connection and separation of the word lines WL0~WLn and the dummy bit line DBL of the dummy cell 320.

In other words, in precharge mode, the first switching part 220 and the second switching part 420 invert, through inverters 224 and 424, a disabled upper sense amplifying part selecting signal BISH and a disabled lower sense amplifying part selecting signal BISL which and apply the inverted signals to NMOS transistors 222 and 422 respectively. Therefore, the dummy bit line DBL connected to the dummy cell 320 becomes the precharge voltage VBLP level.

In active mode, the first switching part 220 inverts, through the inverter 224, an enabled upper sense amplifying part selecting signal BISH, and applies the inverted signal to the NMOS transistor 222, thereby floating the dummy bit line DBL of the adjacent dummy cell 320 from the word lines WL0~WLn.

Likewise, in the active mode, the second switching part 420 inverts, through the inverter 424, an enabled lower sense amplifying part selecting signal BISL, and applies the inverted signal to the NMOS transistor 422, thereby floating the dummy bit line DBL of the adjacent dummy cell 320 from the word lines WL0~WLn.

Accordingly, when the semiconductor memory device is in active mode, the dummy bit line DBL (which has been converted to the precharge voltage VBLP level in the precharge mode prior to the active mode) is separated from the word lines WL0~WLn having the high driving voltage VPP level, and therefore it is possible to prevent a short from occurring between the word lines WL0~WLn and the dummy bit line DBL when SAC failure occurs during manufacturing processes.

Accordingly, by preventing a decrease in the voltage level of the word lines WL0~WLn (which occurs when a short exists between the word lines WL0~WLn converted to the high driving voltage VPP level in the active mode and the dummy bit line DBL) it is possible to ensure the stability of read and write operations.

Figure 4:
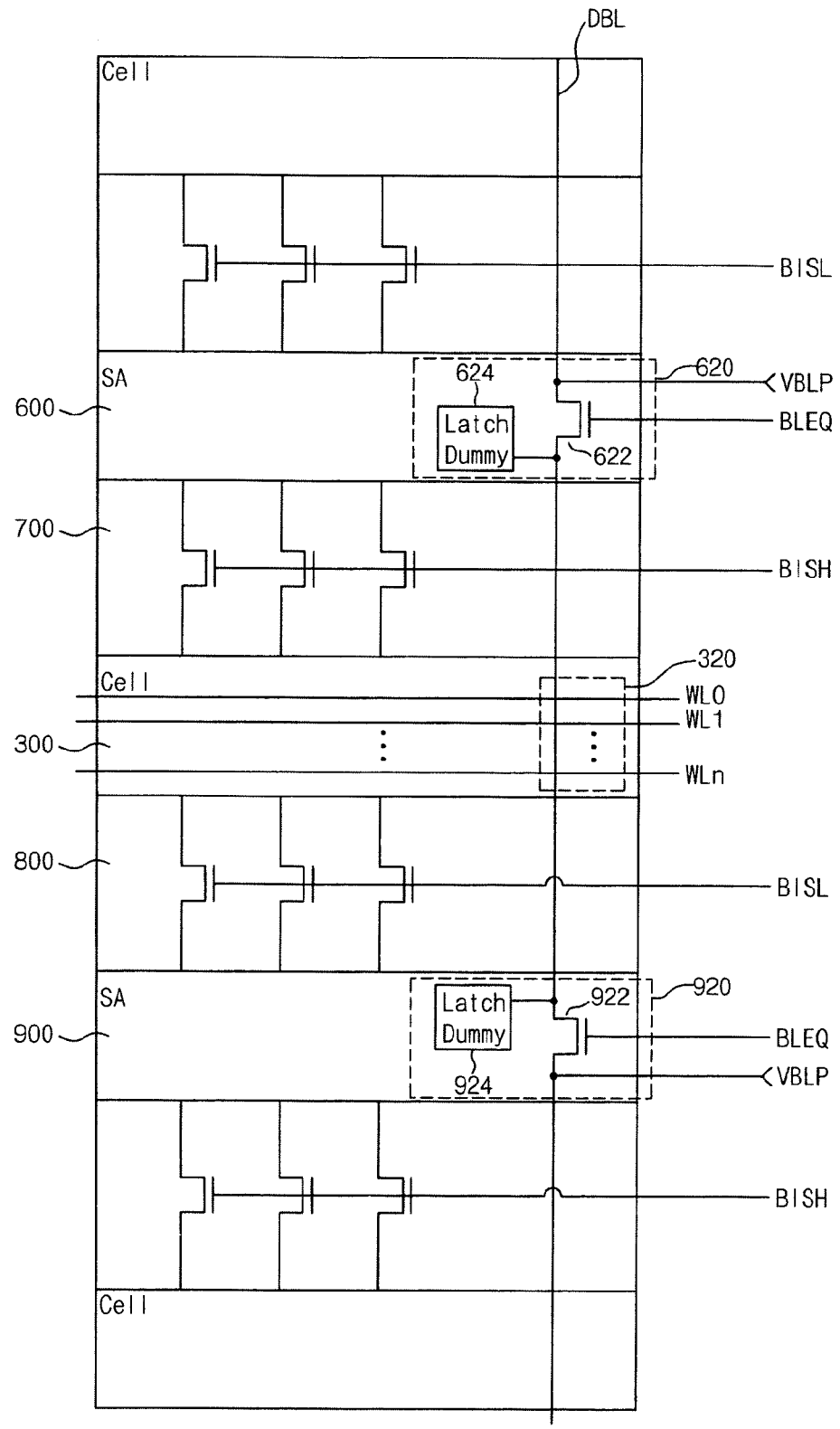
FIG. 4 is a circuit view showing a semiconductor memory device according to another embodiment of the present invention.

FIG. 4 is a circuit view showing a semiconductor memory device according to another embodiment of the present invention. The same symbols will be given to the components of FIG. 4 that are the same components as those shown in FIG. 3, a detailed description of which is omitted.

In the embodiment shown in FIG. 4, the dummy bit line is controlled using an equalization command signal, in contrast to the above described embodiment, which controls the dummy bit line using the upper and lower sense amplifying part selecting signals BISH and BISL.

A third switching part 620 and a fourth switching part 920 are located at the periphery of the sense amplifying parts 600 and 900 and are connected to the dummy cell 320. During precharge mode, the equalization command signal BLEQ is enabled, and the NMOS transistors 622 and 922 receive the enabled equalization command signal BLEQ. The dummy bit line DBL becomes the precharge voltage VBLP level and the word lines WL0~WLn become the ground voltage VSS level.

During active mode, a disabled equalization command signal BLEQ is applied to the NMOS transistors 622 and 922 so that the dummy bit line DBL is floated, and thereby the high driving voltage VPP of the word lines WL0~WLn is ensured.

As such, by controlling the dummy bit line DBL and the word lines WL0~WLn in the dummy cell 320 according to the operation mode, it is possible to prevent the word lines WL0~WLn and the dummy bit line DBL from forming a short in the dummy cell 320.

Figure 5:
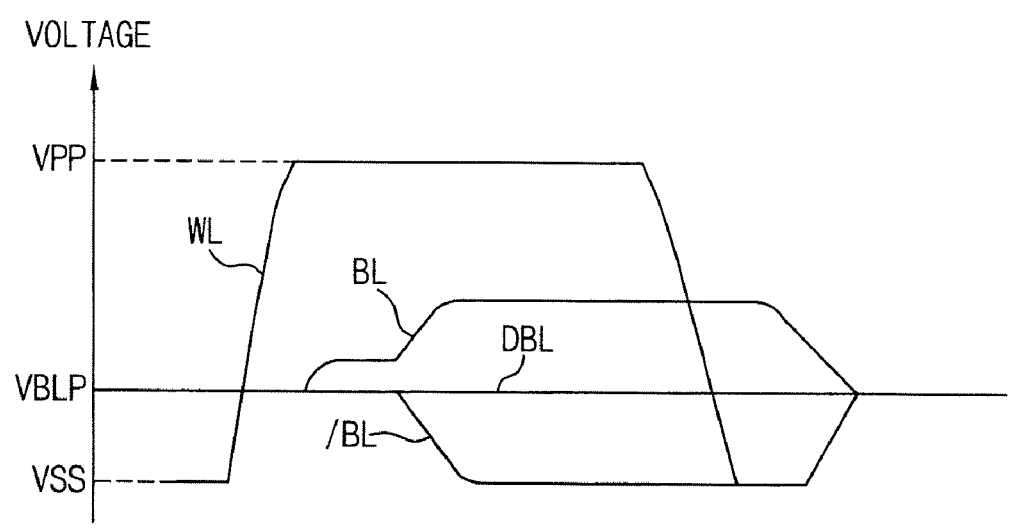
FIG. 5 is a timing diagram of the semiconductor memory device according to an embodiment of the present invention.

FIG. 5 is a timing diagram of the semiconductor memory device according to an embodiment of the present invention. When referring to FIG. 5, it can be appreciated that there is almost no change in the high driving voltage VPP level of the word line WL when the dummy bit line is floated during active mode.

Therefore, the semiconductor memory device of the present invention ensures data transmission of the cell for reading or writing data by stably maintaining the driving voltage VPP level of the word line during the active mode.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device including a cell array and a sense amplifier adjacent to the cell array, the semiconductor memory device comprising:
   a dummy cell formed at a peripheral portion of the cell array such that a dummy bit line and a word line intersect; and
   a control circuit switching a connection state between a first section of the dummy bit line passing through the cell array and a second section of the dummy bit line passing through the sense amplifier,
      wherein the connection state switches according to an operation mode of the cell array, such that the dummy bit line is floated when the operation mode is an active mode and a precharge voltage is provided to the dummy bit line when the operation mode is a precharge mode.

2. The semiconductor memory device as set forth in claim 1, wherein the control circuit comprises a first control part and a second control part respectively connected to an upper part and a lower part of the dummy cell, wherein the first control part and the second control part float the dummy bit line simultaneously when the operation mode is an active mode.

3. The semiconductor memory device as set forth in claim 2, wherein the first control part receives an inverted selecting signal for enabling the sense amplifying part connected to the upper part of the cell array, wherein the selecting signal is enabled during the active mode.

4. The semiconductor memory device as set forth in claim 2, wherein the second control part receives an inverted selecting signal for enabling the sense amplifying part connected to the lower part of the cell array, wherein the selecting signal is enabled during the active mode.

5. The semiconductor memory device as set forth in claim 2, wherein the first and second control parts receive an inverted bit line equalization command signal during the active mode.

6. A semiconductor memory device, comprising:
   a cell array comprising a normal cell and a dummy cell formed at a peripheral portion of the cell array,
      wherein each of the normal cell and the dummy cell correspond to a word line and a bit line that intersect; and
   a switching circuit switching the bit line corresponding to the dummy cell according to an operation mode of the cell array,
      wherein the switching circuit floats the bit line corresponding to the dummy cell when the operation mode is an active mode and provides a precharge voltage to the bit line corresponding to the dummy cell when the operation mode is a precharge mode.

7. The semiconductor memory device as set forth in claim 6, wherein the switching circuit includes a first switching part and a second switching part respectively connected to an upper part and a lower part of the dummy cell, wherein the first switching part and the second switching part simultaneously float the bit line corresponding to the dummy cell.

8. The semiconductor memory device as set forth in claim 7, wherein the first switching part receives an inverted selecting signal for enabling the sense amplifying part connected to the upper part of the cell array, wherein the selecting signal is enabled during the active mode.

9. The semiconductor memory device as set forth in claim 7, wherein the second control part receives an inverted selecting signal for enabling the sense amplifying part connected to the lower part of the cell array, wherein the selecting signal is enabled during the active mode.

10. The semiconductor memory device as set forth in claim 7, wherein the semiconductor memory device further comprises sense amplifiers formed adjacent to the cell array in an upper part of the cell array and a lower part of the cell array,
   wherein the first and second switching parts are formed in a periphery of the sense amplifier, and the first and second switching parts receive a bit line equalization command signal, wherein the bit line equalization signal is disabled during the active mode.

* * * * *